United States Patent [19]

Leung

[11] Patent Number: 4,717,445
[45] Date of Patent: Jan. 5, 1988

[54] ETCH BIAS MONITORING TECHNIQUE

[75] Inventor: Howard K. H. Leung, Austin, Tex.

[73] Assignee: Motorola, Inc., Schaumburg, Ill.

[21] Appl. No.: 843,457

[22] Filed: Mar. 24, 1986

[51] Int. Cl.$^4$ ............................................. H01L 21/306
[52] U.S. Cl. ..................................... 156/626; 156/643; 156/652
[58] Field of Search ........................ 156/626, 643, 652

[56] References Cited

U.S. PATENT DOCUMENTS 4,447,290 5/1984 Matthews ........................... 156/626
4,512,847 4/1985 Brunsch et al. .................. 156/643 X Primary Examiner—S. Leon Bashore
Assistant Examiner—Thi Dang
Attorney, Agent, or Firm—John A. Fisher; Jeffrey Van Myers; David L. Mossman

[57] ABSTRACT

A method for determining the etch bias of a particular semiconductor device feature layer material in a given etch process employing a hard mask reference material that changes very little or not at all during the etch under examination, and using a cross-sectional examination of the critical dimensions to determine the bias. Silicon dioxide would be a suitable hard mask material for a plasma etch bias study, for example. Preferably, a scanning electron microscope would determine the etch bias in one microphotograph. The need for optically taking two or more separate measurements to optically determine the etch bias, and the possiblility for incorporating error between measurements, is eliminated. In addition, the contribution of photoresist erosion to the etch bias of the device feature layer may be independently determined.

19 Claims, 7 Drawing Figures

ETCH BIAS MONITORING TECHNIQUE

FIELD OF THE INVENTION

The invention relates to etch processes used in integrated circuit manufacture and more particularly relates to etch bias monitoring techniques used in such etch processes.

BACKGROUND OF THE INVENTION

An important part of integrated circuit manufacture concerns "pattern transfer" or the implementation of a pattern, as defined by a masking layer that has been photolithographically patterned, in a film, layer or substrate by chemical or physical methods that produce surface relief. The various devices of an integrated circuit and the interconnections between them are formed by the interrelations of the various surface relief patterns.

Very large scale integration (VLSI) processes that are commonly used today in the manufacture of integrated circuits employ a subtractive method of pattern transfer. In subtractive pattern transfer, the layer to be etched is deposited first, and a masking layer, typically photoresist (although other materials are used), is then patterned photolithographically and the unwanted portions of the photoresist are removed by a chemical developer, thereby exposing the underlying layer to be etched. Finally, the exposed portions of the layer are etched away by physical or chemical means.

The resolution of an etching process is a measure of the fidelity of pattern transfer, which can be quantified by an etch bias quantity. Bias refers to the difference in lateral dimension between the etched image and the mask image. In the formula most commonly used at present, two parameters give the bias according to the equation $B=(d_m-d_f)$, where B stands for the etch bias, $d_m$ is the length of a particular critical dimension (CD) as measured along the mask image made in the photoresist before any etching of the device feature layer and $d_f$ represents the final length of the CD measured along the surface of the etched layer.

A zero-bias process produces a vertical edge profile coincident with the edge of the mask. In other words, the mask, the etched device feature layer and the patterned photoresist would all be precisely aligned. In this case, there is no etching of the device feature layer or the photoresist in the lateral direction, and the pattern is perfectly transferred. This case represents the extreme of anisotropic etching. In VLSI processes, achieving an anisotropic etch can be very important in the manufacture of some devices. However, as a practical matter, a completely anisotropic etch is unachievable in many instances. Hence, measurement of bias is necessary to know how to compensate for the bias in the design of the photomask and the device fabrication process so that after the etch is completed the surface relief is as desired, with the bias being taken into account.

In VLSI device fabrication, there are stringent CD control requirements in plasma etching in particular. In general during plasma etch production and process development, calibrated optical measurement equipment is used to measure the selected critical dimension both before etch and after etch to determine the etch bias. However, the calibration of optical instruments involves a lengthy routine which is very sensitive to film thickness, etch profile, resist profile, program parameter settings, etc. Currently, it is common to use a scanning electron microscope (SEM) to aid in the calibration of the optical equipment. It would be desirable to have an etch bias determination technique that would not require such an extensive calibration procedure and which would eliminate some of the sensitivity to sources of error such as etch profile and resist profile. In addition, optical inspection of the resulting device features can only be accomplished by an inspection after the photoresist layer is removed because only vague and hazy lines may be seen if the device feature is inspected with the photoresist in place due to the semi-transparent or translucent nature of the photoresist material. In other words, the edge of the device feature after etch, with the photoresist in place, appears blurred from above by automatic and even visual inspection due to the light scattering caused by the edge of the remaining photoresist layer. The photoresist edge being beveled inward also contributes to the blurring effect.

Discussion of prior bias measurement techniques will be continued with reference to FIG. 2 of the drawings. Shown in FIG. 2A is a semiconductor device under construction 20 having a device feature layer 24 which has been formed upon semiconductor substrate 22. Previous to this step, a photoresist layer 28 has been formed over the device feature layer 24 and patterned by well-known photolithographic means, and the photoresist 28 has a dimension of $d_m$ which is measured from above optically according to the present technique.

At this stage, the physical or chemical etch of the device feature layer 24 is ready to occur. This etching gives a structure such as that seen in FIG. 2B, viewed from above as would be typical in an optical measurement procedure, where the device feature layer 24 has been formed having the dimension $d_f$, which is reduced from the $d_m$ dimension. Note that photoresist feature 28 has been removed from FIG. 2B so that measurement $d_f$ may be determined. From FIG. 2B, the etch bias may be taken as $B=(d_m-d_f)$. However, to obtain B, two separate measurements must be made of the semiconductor device under construction 20, since $d_m$ can only be measured from the FIG. 2A structure and $d_f$ can only be measured from the FIG. 2B structure. The dimension of $d_m$ shown on FIG. 2B in dashed lines is presented for comparison purposes only and would not be seen in any manner at this stage in the process. It would be desirable if an etch bias monitoring technique could be devised which would only require one examination step instead of two.

FIG. 2C illustrates in profile a particular situation that must be addressed by an etch bias monitoring technique, namely the situation where the device feature layer 24 etches away faster than and undercuts the photoresist layer 28. Here, B again equals $(d_m-d_f)$. It is apparent that the etch bias cannot be determined optically by the method used in FIG. 2B with the photoresist 28 in place.

An additional problem concerns measuring the amount the photoresist layer 28 is etched back away from the mask edges ($d_m$) and how this affects the etch bias of the device feature layer 24. Under the current optical inspection procedure, such a measurement would be very difficult.

The only possible approach would be to measure the photoresist layer 28 from above optically to obtain the CD measurement for the photoresist 28 remaining, if possible, and then remove the photoresist layer 28 and conduct an optical inspection to obtain $d_f$ to compare with $d_m$ from a previous measurement procedure. This optical measurement procedure would require three different measurement sessions, and would be of doubtful accuracy due to the blurring of the edges of the photoresist pattern 28 and device feature layer 24 mentioned earlier. Even if a SEM of the profile were made, all of the information required to determine the bias would still not be present for the $d_m$ parameter cannot be measured from the structure only seen in FIG. 2C. At least two measurement steps would again be required.

SUMMARY OF THE INVENTION

Accordingly, it is an object of the present invention to provide an etch bias monitoring technique that involves a simple calibration routine for the measuring equipment.

Another object of the invention is to provide an etch bias monitoring technique where the critical dimensions are measured from the side or in profile rather than from the top to enhance the measurement precision.

Still another object of the invention is to provide an etch bias monitoring technique where the measurements required to determine bias may be made in one measuring session rather than in two or three separate examinations to avoid confusion that may result from the delay between measurements.

It is another object of the present invention to provide an etch bias monitoring technique that can be conducted with remaining photoresist in place, and which can measure the amount of photoresist erosion after the etch of the device feature layer so that the contribution of photoresist erosion on the etch bias may be taken into account.

Yet another object of the present invention is to provide an etch bias monitoring technique that employs equipment readily available in most integrated circuit fabrication facilities.

In carrying out these and other objects of the invention, there is provided, in one form, an etch bias monitoring technique for determining the etch bias of a device feature layer, by examining a cross-sectional profile of a critical dimension feature comprising at least two different layers, a hard mask reference layer and a device feature layer. The next step involves obtaining measurements of the cross-sectional profile of a critical dimension feature of the device feature layer and the hard mask reference layer, comparing the measurements of the device feature layer to the measurement of the hard mask reference layer to determine the bias. In one embodiment, a SEM is used to examine the cross-sectional profile of the critical dimension of interest.

DETAILED DESCRIPTION OF THE INVENTION

Figure 1A:
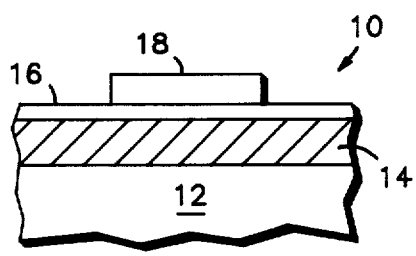
FIGS. 1A through 1D give various cross-sections of a semiconductor device or critical dimension feature under construction according to the etch bias monitoring technique of the present invention.

Shown in FIG. 1A is a semiconductor device 10 under construction to demonstrate the bias determination technique of the present invention. Substrate 12 has formed upon it device feature layer 14 to be etched and for which bias is to be measured. The method of the present invention can be applied to monitor the etching of various layers, such as silicon nitride, polycrystalline silicon, metal silicides, aluminum, etc. Of course, the etch bias may be examined for any etch process desired, wet etch, plasma etch, reactive ion etching (RIE), etc. For the purposes of illustration of this invention only, device feature layer 14 will be taken to be aluminum and the etch process will be taken to be a plasma etch. Formed over device feature layer 14 is a highly selective material as a hard mask reference layer 16. By highly selective, it is meant that hard mask reference layer 16 does not etch appreciably in the etch procedure used, which in this instance is a plasma etch, relative to the material of device feature layer 14. A suitable substance for hard mask reference layer 16 where feature layer 14 is aluminum and the etch is a plasma etch would be silicon dioxide.

Figure 1B:
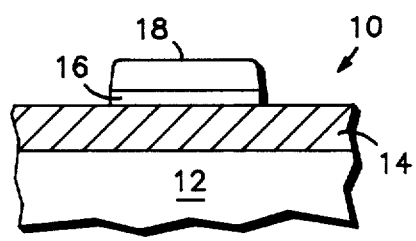

Also seen in FIG. 1A is photoresist layer 18, which has already been patterned. FIG. 1B illustrates a cross-section of a device 10 or critical dimension feature under construction after the hard mask reference layer 16 has been patterned. It is entirely reasonable using current technology to expect that edges of the remaining photoresist pattern 18 and the edges of hard mask reference layer 16 to exactly correspond as seen in FIG. 1B. Note that no measuring step is yet required.

Figure 2A:
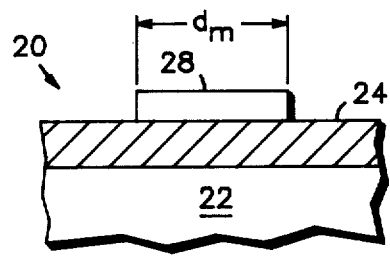
FIGS. 2A through 2C give various cross-sections and a plan view of a semiconductor device or critical dimension feature under construction according to the process of the prior art.

Shown in FIG. 2A is semiconductor device or critical dimension feature 20 under construction where substrate 22 supports device feature layer 24 and photoresist layer 28. Note the absence of a hard mask reference layer. FIG. 2A shows device 20 in the stage after photoresist layer 28 has been exposed and the unwanted areas of photoresist have been stripped away. In prior art methods of monitoring bias, the selected critical dimension, for example the width of the pattern shown as $d_m$, must be measured during the step illustrated in FIG. 2A. This is the first discrete measuring step of at least two required in the prior art method. It should also be emphasized that the measurement of the critical dimension at the photomask level, $d_m$, is done by optical methods from above the feature. However, since the calibration of most optical equipment now involves the use of a scanning electron microscope, it makes more sense to simply use an SEM to monitor the etch bias if it can be done in one step, which it may according to the technique of this invention. However, in the prior art method which does not use a hard mask reference layer 16, at least two measurements would have to be made since the original mask CD ($d_m$) and $d_f$ could not be determined in the same measuring session.

Figure 1C:
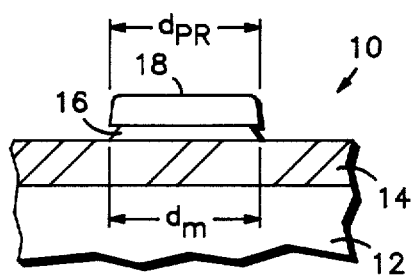

Shown in FIG. 1C is semiconductor device or CD feature 10 under construction, after the patterning of hard mask reference layer 14. At this step, the measurements for $d_{PR}$ (photoresist CD distance) and $d_m$ would be identical.

If the correct materials are chosen for the device feature layer 14 and hard mask reference layer 16 relative to selectivity, hard mask reference layer 16 shows little or no etching as a result of the plasma etch designed for the device feature layer 14. As a result, a cross-section or profile inspection of the layers after plasma etch shown in FIG. 1D in one measuring session can give all of $d_m$, $d_f$ and $d_{PR}$ or a and b. Etch bias, B, can also be defined as the greater of 2a or 2b where a is defined as the distance the edge the photoresist layer 18 has retreated from the edge of the hard mask reference layer 16, and b is defined as the distance from the edge of the device feature layer 14 to the edge of the hard mask reference layer 16. Distances a and b are useful to know in understanding the contributions of device feature layer 14 erosion and photoresist 18 erosion, respectively, alone to the total bias so that the overall device fabrication process may be improved. This information was previously unavailable via the customary optical measurement technique. The photoresist contribution can also be seen from the measurement of $d_{PR}$ taken from the same profile. The photoresist erosion component $B_{PR}$ may be calculated from the formula $B_{PR} = (d_m - d_{PR})$. An alternate way of calculating etch bias besides $B = d_m - d_f$ is to use the greater of 2a or 2b to obtain the same value.

Figure 1D:
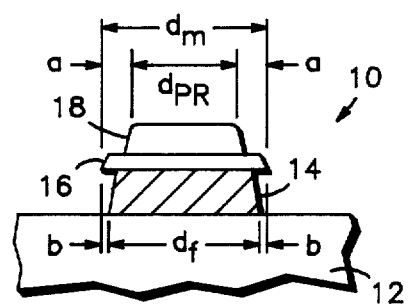

One of the best ways of inspecting a device 10 under construction in a profile view is by means of a SEM microphotograph. An exact, direct measurement of $d_m$ can be taken from the remaining hard mask reference layer 14; an exact, direct measurement of $d_f$ can be taken from the remaining device feature reference layer portion 14; and an exact, direct measurement of $d_{PR}$ can be taken from the remaining photoresist layer 18, all in one measurement taking session from a SEM microphotograph. Also, if the shape of the sides of the profile of device feature layer 14 slope inward as seen in FIG. 1D, this fact can be readily noted and the measurement can compensate for the shape since a side view is inspected, for example, as in the instance where a critical dimension other than the bottom edge to bottom edge measurement is taken, if desired.

It should also be noted for the method of this invention that it does not matter if photoresist layer 18 is affected by the plasma etch of device feature layer 14, for the $d_m$ CD is preserved by the hard mask reference layer 16. Recall also that the various contributions to etch bias, a and b may also be directly determined from a SEM microphotograph of a structure such as that seen in FIG. 1D. In addition, the etch bias monitoring technique of the present invention is independent of whether the device feature layer 14 is etched faster or slower than the photoresist pattern 18.

In patterning the hard mask reference layer 16, the possibility of hard mask etch bias contribution must be considered. First, the hard mask reference layer 16 should be made as thin as possible to minimize the effect from undercutting beneath the photoresist layer 18. Also, even though the photoresist layer 18 might be eroded during hard mask line-up at the edge, it will still not be confused with the etch bias from the plasma processing itself.

In the case where the hard mask 16 experiences etching beyond that of the photo resist mask 18, a SEM picture may be taken of a cross-section after hard mask 16 patterning to correct for the etch bias contribution due to erosion of hard mask reference layer 16 during the plasma etch of the device feature layer 14 as seen in FIG. 1C where $d_m$ is slightly smaller than $d_{PR}$. This way, even the undercutting from the hard mask 16 patterning is compensated for. However, if proper judgment is used in the selection of masking materials and mask patterning techniques, the correction procedures for the reference layer mentioned above should rarely be needed.

Figure 2B:
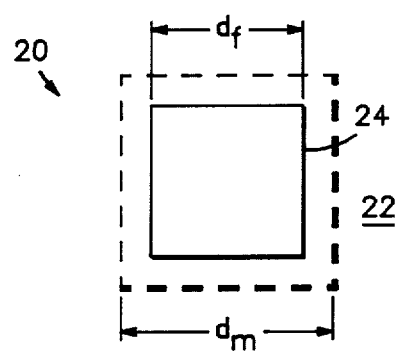
Figure 2C:
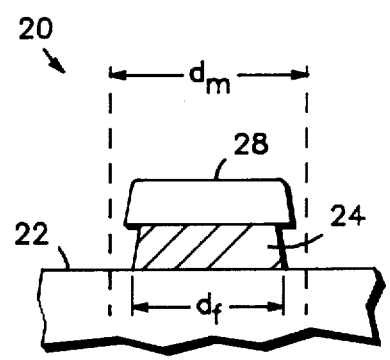

Shown in FIG. 2C is semiconductor device 20 under construction after the plasma etch of device feature layer 24. Note also that the remaining photoresist layer 28 pattern would have to be removed before the critical dimension measurement of $d_f$ can be taken optically from above the feature as illustrated in FIG. 2B. This is the third measurement taking session required by the prior art technique, if the photoresist erosion contribution is desired, in the situation where device feature layer 24 undercuts photoresist layer 28, since $d_m$ is not determinable from a structure such as seen in FIG. 2C. Note additionally that if the sides of the device feature layer profile 24 slope inward that it would be impossible to detect from above and the measurement of $d_f$ could not be compensated therefor, if desired.

In a production environment, many monitor wafers similar to that illustrated in FIGS. 1A through 1D can be prepared. A predetermined number of monitor wafers would be included in a product lot to be processed through the desired etch step. The monitor wafers can then be used to check etch bias by the technique of the present invention. During process development, similar procedures can be employed to check CD control of the process being developed. Then the etch process or the photomask could be altered as needed to compensate for variations in the etch bias for a particular device feature layer.

Another approach that might be used is to guess at a possible etch bias when designing the photomask and process, and then use the etch bias monitoring technique of the present invention to determine via an iterative scheme to find the final etch bias needed to be used when designing the etch process and the photomasks.

I claim:

1. In an etch bias monitoring technique for determining the etch bias of a device feature layer, the improvement comprising the steps of:

examining a cross-sectional profile of an etched critical dimension feature comprising at least two different layers: a hard mask reference layer and a device feature layer;

obtaining measurements of the cross-sectionl profile of a critical dimension feature of the hard mask reference layer, $d_m$, the same critical dimension feature of the device feature layer, $d_f$, the distance from one edge of the photoresist layer to the edge of the hard mask reference layer, a, and the distance from one edge of the hard mask reference layer to the edge of the device feature layer, b; and calculating the etch bias, B, by a method selected from the group of methods consisting of:

comparing $d_m$ with $d_f$; and calculating the value of 2a and 2b and taking the greater value.

2. In an etch bias monitoring technique for determining the etch bias of a device feature layer and correcting a photomask by the bias, the improvement comprising the steps of:

examining a cross-sectional profile of an etched critical dimension feature comprising a photoresist layer, a hard mask reference layer and a device feature layer;

obtaining measurements of the cross-sectional profile of a critical dimension feature of the device feature layer, $d_f$, the hard mask reference layer, $d_m$, the photoresist layer, $d_{PR}$, the distance from one edge of the photoresist layer to the edge of the hard mask reference layer, or, and the distance from one edge of the device feature layer to the edge of the hard mask reference layer, b; and calculating the etch bias, B, by a method selected from the group of methods consisting of:

comparing $d_m$ with $d_f$;
comparing $d_m$ with $d_{PR}$; and
calculating the value of 2a and 2b and taking the greater value.

3. The etch bias monitoring technique of claim 2 wherein the examination of the cross-sectional profile is conducted by means of a scanning electron microscope photograph.

4. The etch bias monitoring technique of claim 2 wherein the etch bias is calculated by means of the formula $B = (d_m - d_f)$.

5. In an etch bias monitoring technique employing a hard mask reference layer and a device feature layer, for determining an undercutting contribution to the etch bias of the device feature layer and correcting a photomask and/or a process by the bias, the improvement comprising the steps of:
examining a cross-sectional profile of a critical dimension feature comprising at least two different layers: a hard mask reference layer and a device feature layer, after the etch of the device feature layer;
obtaining a measurement of the critical dimension feature from the hard mask reference layer, $d_m$, and a measurement of the critical dimension feature from the device feature layer, $d_f$; and
calculating the undercutting contribution to the etch bias, B, by comparing $d_m$ and $d_f$.

6. The etch bias monitoring technique of claim 5 wherein the examination of the cross-sectional profile is conducted by means of a scanning electron microscope photograph.

7. The etch bias monitoring technique of claim 5 wherein the undercutting contribution to the etch bias is obtained by means of the formula $B = (d_m - d_f)$.

8. The etch bias monitoring technique of claim 5 wherein the undercutting contribution to the etch bias B is equal to 2b, where b is the distance from one edge of the device feature layer to the edge of the hard mask reference layer.

9. In an etch bias monitoring technique employing a photoresist layer and a hard mask reference layer, for determining a photoresist erosion contribution to the etch bias and correcting a photomask and/or a process by the bias, the improvement comprising the steps of:
examining a cross-sectional profile of a critical dimension feature comprising at least two different layers: a photoresist layer and a hard mask reference layer, after the etch of the hard mask reference layer;
obtaining a measurement of the critical dimension feature from the photoresist layer, $d_{PR}$, and a measurement of the critical dimension of the hard mask reference layer, $d_m$; and
calculating the photoresist erosion contribution to the etch bias, $B_{PR}$, by comparing $d_m$ and $d_{PR}$.

10. The etch bias monitoring technique of claim 9 wherein the examination of the cross-sectional profile is conducted by means for a scanning electron microscope photograph.

11. The etch bias monitoring technique of claim 9 wherein the photoresist erosion contribution to the etch bias, $B_{PR}$, is obtained by means of the formula $B_{PR} = (d_m - d_{PR})$.

12. The etch bias monitoring technique of claim 9 wherein the photoresist erosion contribution to the etch bias $B_{PR}$ is equal to 2a, where a is the distance from one edge of the photoresist layer to the edge of the hard mask reference layer.

13. In an etch bias monitoring technique employing a photoresist layer, a hard mask reference layer and a device feature layer, for determining the etch bias of the device feature layer and correcting a photomask and/or a process by the bias, the improvement comprising the steps of:
providing a substrate;
forming the device feature layer on the substrate;
forming the hard mask reference layer over the device feature layer;
forming the photoresist layer over the hard mask reference layer;
patterning the photoresist layer by means of the photomask having a critical dimension feature;
anisotropically etching the selected areas of the hard mask reference layer to pattern the hard mask reference to correspond to the photoresist pattern;
etching the device feature layer;
measuring the cross-sectional profile of the critical dimension feature to obtain measurements of the device feature layer, $d_f$, the hard mask reference layer, $d_m$, the distance from one edge of the photoresist layer to the edge of the hard mask reference layer, a, and the distance from one edge of the device feature layer to the edge of the the hard mask reference layer, b; and
calculating the etch bias, B, by a method selected from the group of methods consisting of:
calculating $B = (d_m - d_f)$; and
choosing the greater of 2a or 2b.

14. The etch bias monitoring technique of claim 13 wherein the measurement of the cross-sectional profile is conducted by means of a scanning electron microscope photograph of the cross-sectional profile.

15. In an etch bias monitoring technique employing at least a photoresist layer, a hard mask reference layer and a device feature layer, for determining the etch bias of a device feature layer and using the bias to correct a photomask and/or a process, comprising the steps of:
providing a substrate;
forming the device feature layer on the substrate;
forming the hard mask reference layer over the device feature layer;
forming the photoresist layer over the hard mask reference layer;
patterning the photoresist layer using a photomask having at least one critical dimension;
anisotropically etching across at least one selected critical dimension the hard mask reference layer and simultaneously or subsequently anisotropically etching the device feature layer;
slicing the layers in a vertical direction to provide a cross-sectional profile;
examining the cross-sectional profile of a critical dimension feature comprising at least the three different layers;
obtaining a measurement of the critical dimension feature from the hard mask reference layer ($d_m$), a measurement of the critical dimension feature from the device feature layer ($d_f$), a measurement of the distance from one edge of the photoresist layer to the edge of the hard mask layer (a) and a measurement of the distance from one edge of the device feature layer to the edge of the hard mask reference layer (b); and
calculating the etch bias, B, by a method selected from the group of methods consisting of:
calculating $B = (d_m - d_f)$; and choosing the greater of 2a or 2b.

16. The etch bias monitoring technique of claim 15 wherein the examination of the cross-sectional profile is conducted by means of a scanning electron microscope photograph.

17. The etch bias monitoring technique of claim 15 in which the hard mask reference layer is silicon dioxide.

18. In an etch bias monitoring technique employing at least a photoresist layer, a hard mask reference layer and a photoresist layer for determining the etch bias of a device feature layer to compensate a photomask and/or a process, comprising the steps of:

providing a substrate;

forming the device feature layer on the substrate;

forming the hard mask reference layer over the device feature layer;

patterning a photoresist layer over the hard mask reference layer, exposing selected areas thereof, including a critical dimension feature to be measured;

anisotropically etching selected areas of the hard mask reference layer exposed by the photoresist;

anisotropically etching the device feature layer;

slicing the layers along the direction of the critical dimension feature to be measured;

taking a scanning electron microscope (SEM) microphotograph of the critical dimension feature;

obtaining measurements a and b wherein a is the distance from one edge of the photoresist layer to the edge of the hard mask reference layer and b is the distance from one edge of the device feature layer to the edge of the hard mask reference layer dimension feature;

determining the etch bias B as being the greater of 2a and 2b; and compensating the etch process or the photomask based on the etch bias.

19. The etch bias monitoring technique of claim 18 in which the hard mask reference layer is silicon dioxide.

* * * * *

UNITED STATES PATENT AND TRADEMARK OFFICE
CERTIFICATE OF CORRECTION

PATENT NO. : 4,717,445

DATED : January 5, 1988

INVENTOR(S) : Howard K.H. Leung

It is certified that error appears in the above-identified patent and that said Letters Patent is hereby corrected as shown below:

In claim 1, column 6, line 38, please change "cross-sectionl" to --cross-sectional--.

In claim 2, column 6, line 64, please change "or" to --a--.

In claim 10, column 7, line 58, please change "for" to --of--.

Signed and Sealed this

Fourteenth Day of June, 1988

Attest:

DONALD J. QUIGG

Attesting Officer     Commissioner of Patents and Trademarks